United States Patent [19]

Vanco et al.

[11] Patent Number: 5,764,586
[45] Date of Patent: Jun. 9, 1998

[54] INTERMEDIATE SIZE NON-VOLATILE ELECTRICALLY ALTERABLE SEMICONDUCTOR MEMORY DEVICE

[75] Inventors: Radu Vanco, Monte Sereno; Gelu Voicu, San Jose; Dumitru Cioaca; Fred Leung, both of Cupertino, all of Calif.

[73] Assignee: Catalyst Semiconductor, Inc., Sunnyvale, Calif.

[21] Appl. No.: 729,009

[22] Filed: Oct. 10, 1996

[51] Int. Cl.$^6$ .................................................. G11C 8/00
[52] U.S. Cl. ................ 365/230.06; 365/51; 365/185.22
[58] Field of Search ................... 365/51, 52, 230.06, 365/185.18, 185.22

[56] References Cited

U.S. PATENT DOCUMENTS 5,400,293  3/1995  Iguchi et al. ...................... 365/51 X
5,517,630  5/1996  Tasaki ...................... 365/230.06 X
5,590,071  12/1996  Kolor et al. ...................... 365/230.06 X

*Primary Examiner*—David C. Nelms
*Assistant Examiner*—Huan Hoang
*Attorney, Agent, or Firm*—Beyer & Weaver, LLP

[57] ABSTRACT

A semiconductor memory device that operates as a normal memory device as long as existing memory is being addressed, but appears to external hardware and software to have a larger size (or standard size) memory array than is actually present in the semiconductor memory device is disclosed. To external hardware and software, the semiconductor memory device operates as if it has more addressable memory cells than in fact actually exist in the memory array. When addressing missing memory cells, the semiconductor memory device emulates or mimics their presence for the benefit of the external hardware or software. Preferably, the semiconductor memory device is a non-volatile electrically alterable semiconductor memory device. A method for emulating missing memory cells is also disclosed.

5 Claims, 10 Drawing Sheets

INTERMEDIATE SIZE NON-VOLATILE ELECTRICALLY ALTERABLE SEMICONDUCTOR MEMORY DEVICE

BACKGROUND OF THE INVENTION

1. Field of the Invention

The present invention relates to semiconductor memory devices and, more particularly, to electrically alterable semiconductor memory devices.

2. Description of the Related Art

Electronically alterable semiconductor memory devices include, for example, Electrically Erasable Programmable Read-Only Memory (EEPROM) devices and FLASH memory. The electronically alterable semiconductor memory devices operate like Read-Only Memory (ROM) in that they provide non-volatile storage of digital data but offer the advantage of being electrically programmable.

Manufacturers of electrically alterable semiconductor memory devices continually strive to increase density and speed. Density of memory cells in semiconductor devices is very important in the competitive semiconductor memory industry. Operational speeds (e.g., access time, program time) are also important for semiconductor memory devices. Hence, there is an ongoing desire to provide memory devices offering greater density and faster speed.

Conventionally, EEPROM or FLASH memory chips are offered in set sizes of 512 Kb (kilobits), 1 Mb (megabits), 2 Mb, 4 Mb, 8 Mb, 16 Mb and 32 Mb. Notice that each next larger size is a power of two larger than the previous size. As a result, in many applications, one has to use a memory chip that has much more memory storage capacity than needed. For example, if an application needs to store 1.2 Mb, then a 2 Mb memory chip is needed which results in 0.8 Mb being unused.

For cost reasons, it is desirable to minimize the cost of producing products. Accordingly, it desirable to minimize the memory capacity of the memory chips required by a product (e.g., application) because the greater the memory capacity the greater the cost. It is thus desirable to minimize the amount of wasted or unneeded memory. Due to the conventional (power of two) sizing for memory chips, conventionally products were forced to include more memory than needed. The unneeded or wasted memory due to conventional sizing undesirably increases the cost of the product.

Thus, there is a need for techniques or semiconductor memory devices that reduce the amount of unneeded or wasted memory for products incorporating one or more semiconductor memory devices.

SUMMARY OF THE INVENTION

Broadly speaking, the invention pertains to a semiconductor memory device that operates as a normal memory device as long as existing memory is being addressed, but appears to external hardware and software as a larger size (or standard size) memory array than actually present in the semiconductor memory device. In other words, to external hardware and software, the semiconductor memory device operates as if it has more addressable memory cells than in fact actually exist in the memory array. When addressing missing memory cells, the semiconductor memory device emulates or mimics their presence for the benefit of the external hardware or software. As one example, in the case where the semiconductor memory device is an electrically alterable semiconductor memory device, the emulation may operate as follows: during an erase verify operation the device reports that the missing memory cells have been successfully erased (during an erase operation); during a write verify operation the device reports that the missing memory cells have be written (during a write operation); and during a read operation the device reports that the missing cells are still in their erased state. It should be recognized that other emulations are possible during the various memory operations and that in general the missing cells can be emulated as programmed, erased or some combination thereof. The semiconductor memory device according to the invention is referred to as an intermediate density memory chip or non-standard size memory chip.

The invention can be implemented in numerous ways, including as an apparatus, device, method or computer readable medium. Several embodiments of the invention are described below.

As a programmable and erasable non-volatile memory device having a memory array of addressable memory cells, an embodiment of the invention pertains to an improvement being characterized in that the memory array has a non-standard size and when the memory array is addressed it appears to external hardware/software to be a larger standard size memory array.

As a programmable and erasable non-volatile memory device, another embodiment of the invention includes: a memory array of memory cells; an address decoder coupled to an address bus, the address decoder decodes address signals on the address bus to address particular ones of the memory cells; a device controller coupled to receive control signals and to command operations of the device in accordance with the control signals; an output buffer coupled to the memory array and a data bus; a missing cells address decoder coupled to the address bus, the missing cells address decoder decodes that portion of the memory array that is addressable but for which memory cells are missing and therefore not present in the memory array; and a memory cell emulator coupled to the device controller, the output buffer and the missing cells address decoder, the memory cell emulator operates to emulate actual memory cells for the missing memory cells.

As a method for emulating a data storage device with a first memory array of a first array size using a programmable and erasable non-volatile memory device with a second memory array of a second array size, the first array size being greater than the second array size, an embodiment of the invention includes the operations of: addressing memory cells within the second memory array of the second array size as if it was of the first array size; performing a data operation on the addressed memory cells within the second memory array; determining whether the addressing of the memory cells within the second memory array is addressing memory cells not within the second memory array but which would be within the first memory array due to its greater array size; obtaining data associated with the data operation from the addressed memory cells within the second memory array when the addressed memory cells are determined to be within the second memory array; providing predetermined data associated with the data operation for use for the addressed memory cells not within the second memory array but which would be within the first memory array due to its greater array size; and temporarily storing the obtained data for the addressed memory cells within the second memory array and storing the predetermined data for the addressed memory cells not within the second memory array.

As a computer readable media containing program instructions for emulating a data storage device with a first memory array of a first array size using a programmable and erasable non-volatile memory device with a second memory array of a second array size, the first array size being greater than the second array size, an embodiment of the invention includes: first computer readable code devices for addressing memory cells within the second memory array of the second array size as if it was of the first array size; second computer readable code devices for performing a data operation on the addressed memory cells within the second memory array; third computer readable code devices for determining whether the addressing of the memory cells within the second memory array is addressing memory cells not within the second memory array but which would be within the first memory array due to its greater array size; fourth computer readable code devices for obtaining data associated with the data operation from the addressed memory cells with second memory array when the addressed memory cells are determined to be within the second memory array; fifth computer readable code devices for providing predetermined data associated with the data operation for use for the addressed memory cells not within the second memory array but which would be within the first memory array due to its greater array size; and sixth computer readable code devices for temporarily storing the obtained data for the addressed memory cells within the second memory array and storing the predetermined data for the addressed memory cells not within the second memory array.

The advantages to the invention are numerous. One advantage of the invention is that cost savings are obtained using smaller intermediate density memory chips. Another advantage of the invention is that externally the smaller intermediate density memory chips appear to be of the next larger conventional size so that programming and/or interconnection of the memory chips is essentially the same as programming the next larger conventional memory chip. Yet another advantage of the invention is that it makes the use of intermediate density memory chips commercially feasible by making the next larger conventional size memory chip suitable as its second source.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The invention pertains to semiconductor memory devices (e.g., non-volatile electrically alterable semiconductor memory devices) that have an intermediate density for cost savings, yet appear externally to have the density of a next larger conventional sized semiconductor memory device. For example, a conventional sized semiconductor memory device might be a 2 megabit (Mb) memory, and the intermediate density might be a 1.5 Mb or 1.25 Mb memory. As a result, a semiconductor memory device with an intermediate density can be used in place of a more expensive, larger sized conventional semiconductor memory device. Preferably, the semiconductor memory device with an intermediate density according to the invention is an integrated circuit and its pins are compatible to the more expensive, larger sized conventional semiconductor memory device.

Embodiments of the invention are discussed below with reference to the drawings. However, those skilled in the art will readily appreciate that the detailed description given herein with respect to these figures is for explanatory purposes as the invention extends beyond these limited embodiments.

Figure 1:
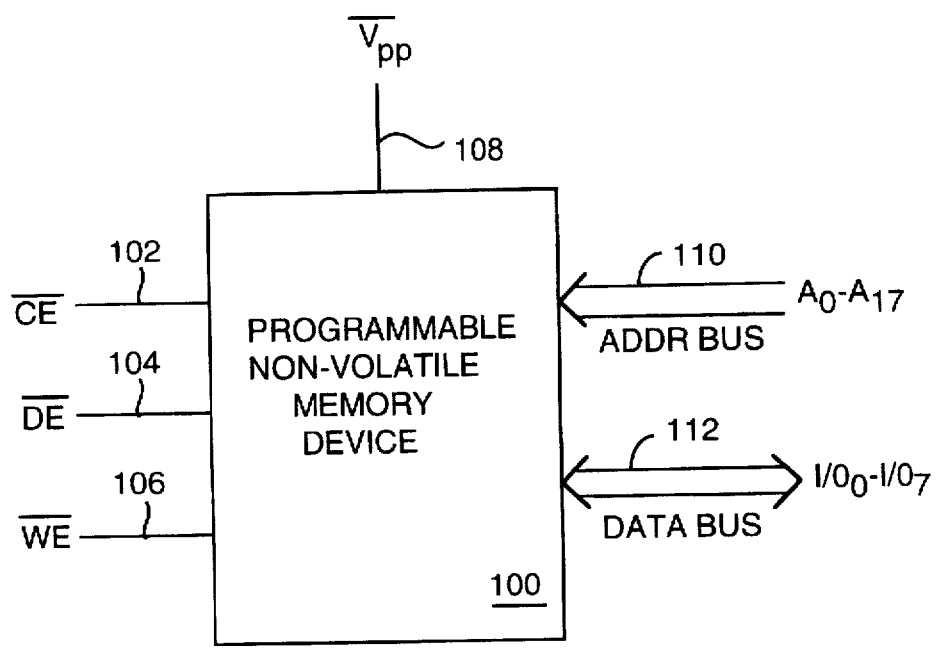
FIG. 1 illustrates a programmable non-volatile memory device.

FIG. 1 illustrates a programmable non-volatile memory device 100. The programmable non-volatile memory device 100 has a number of connections to external devices or signals. In particular, the programmable non-volatile memory device 100 has (among other pins) a chip enable (/CE) pin 102, an output enable (/OE) pin 104, a write enable (/WE) pin 106, and a high voltage potential pin (Vpp) 108. In other designs, the high voltage potential (Vpp) is produced internally so no pin is required. The programmable non-volatile memory device 100 is also coupled to an address bus 110 and a data bus 112. The number of lines supported by the address bus 110 and the data bus 112 can vary. However, in FIG. 1 the address bus 110 is illustrated as having eighteen (18) address lines ($A_0$–$A_{17}$) and the data bus 112 is illustrated as having eight (8) lines ($I/O_0$–$I/O_7$).

The programmable non-volatile memory device 100 is preferably a non-volatile electrically alterable semiconductor memory device. Non-volatile electrically alterable semiconductor memory devices include, for example, Electrically Erasable Programmable Read-Only Memory (EEPROM) devices and FLASH memory. The electrically alterable semiconductor memory devices operate like Read-Only Memory (ROM) in that they provide non-volatile storage of digital data but offer the advantage of being electrically programmable. These non-volatile electrically alterable semiconductor memory devices typically are sold in either of two types of implementations. The first type of implementation is referred to as a "standard" implementation in which status information is obtained by attempting to access the memory device. The second type of implementation is referred to as an "embedded" implementation in which the memory device includes embedded algorithms for controlling data operations and producing status information either by way of a status register or by polling. With the status register design, the status information can be read directly from an addressable status register. On the other hand, with the polling (or non-register) design, the status information is obtained by attempting to read the memory device. In all cases, the status information pertains to one or more flags that serve, for example, to indicate the status of the erasure or programming of the device.

The typical data operations for the programmable non-volatile memory device 100 are erase, write (program) and read. Each of these data operations are now briefly discussed.

An erase operation operates to bring either all the memory cells of a memory array (bulk erase) or a portion of the memory cells of the memory array (sector erase) to a threshold voltage level (e.g., 2 Volts). There are three distinct phases to the erase operation. The first phase is write before erase, the second phase is erase, and the third phase is erase verify. The write before erase phase applies a high voltage to either all (bulk) or some (sector) of the memory cells which are to be erased so as to program them to high thresholds (e.g., 6 Volts). The erase phase operates to apply a voltage to the memory cells being erased in such a way that these memory cells have an intermediate threshold voltage (e.g., 2 Volts). When subsequently reading these erased memory cells, the sense amplifiers detect and I/O buffers output logical "1" values, thus an erased byte is read as $FF_{HEX}$. The erase verify phase is performed after every erase operation. Namely, after every erase operation, the memory cells that are being erased are read. If the threshold of the memory cells being read have the appropriate threshold voltage (e.g., 2 Volts), then the erase has successfully completed. On the other hand, if the threshold of the read memory cells is greater that the appropriate threshold voltage, then the erase operation is repeated. In a "standard" implementation, erase-verify operation is performed by an external read of the memory cells from the I/O buffers. If the external read returns $FF_{HEX}$, then the erase has successfully been executed. In an "embedded" implementation, on the other hand, the erase-verify operation is performed by an internal reading of the memory cells.

A write operation (program operation) is performed in two distinct phases. The first phase involves individually programming bytes of the memory cells in accordance with data provided by data latches via I/O buffers. Only those bits of the byte being programmed to a logical "0" are programmed (changed). The bits of the byte that are supposed to be programmed to a logical "1" need not be altered because an erased byte has all its bits corresponding to logical "1". The second phase involves a write verify operation. The write verify operation is performed after every write operation. In a "standard" implementation, the write verify operation is a normal read operation from the memory array via sense amplifiers and I/O buffers. With an "embedded" implementation, the write verify operation is done internally. In either case, if there is a difference between the byte of data being written and the data read from the memory array, then the write operation is repeated until the write verify operation verifies the successful completion of the write operation.

Figure 2:
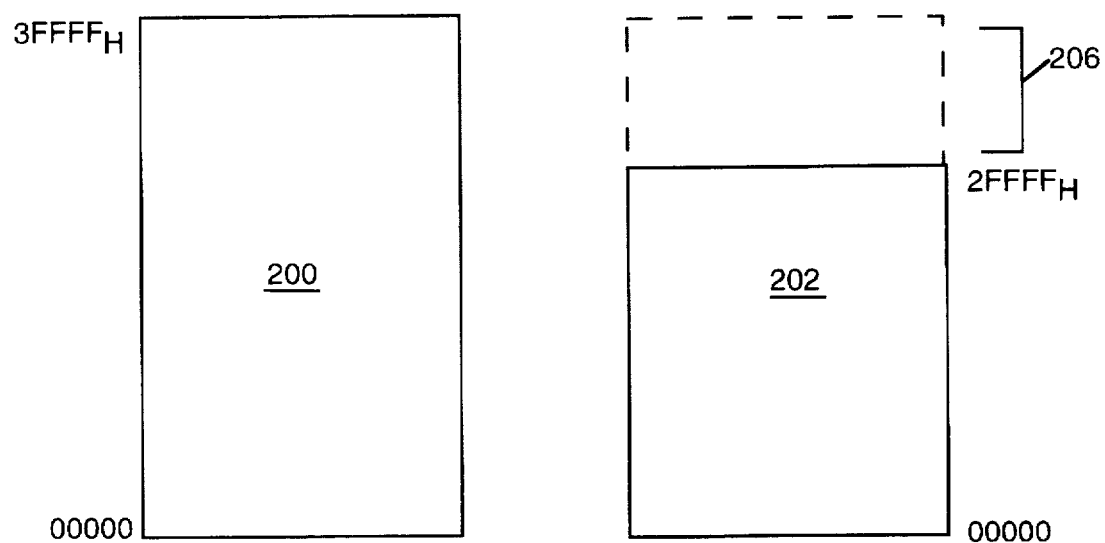
FIG. 2 is a diagram illustrating a conventional density semiconductor memory device and an intermediate density semiconductor memory device according to the invention.

FIG. 2 is a diagram illustrating a conventional density semiconductor memory device 200 and an intermediate density semiconductor memory device 202 according to the invention. The intermediate density semiconductor memory device 202 has a reduced-density as compared to the next larger density (size) conventional density semiconductor memory device 200. In the example illustrated in FIG. 2, the conventional density semiconductor memory device 200 is a 2 Mb memory chip and the intermediate density semiconductor memory device 202 is a 1.5 Mb memory chip. In this example, the conventional density semiconductor memory device 200 has a memory array that supports addresses from "00000" to "3FFFF$_{HEX}$". On the other hand, the intermediate density semiconductor memory device 202 has a memory array that supports addresses from "00000" to "2FFFF$_{HEX}$". Hence, comparing the conventional density semiconductor memory device 200 with that of the intermediate density semiconductor memory device 202 according to the invention, the intermediate density semiconductor memory device 202 has a missing cell area 206. In other words, the intermediate density semiconductor memory device 202 has a smaller memory array, and those cells that are present in the conventional density semiconductor memory device 200 but not actually present in the intermediate density semiconductor memory device 202 are referred to as missing cells. These missing cells are located in the missing cells area 206. The missing cells area 206 can be thought of as a block of addressable memory cells that are missing (i.e., not actually present) from the intermediate density semiconductor memory device 202 but which are present in the next larger sized conventional density semiconductor memory device 200.

The conventional density semiconductor memory device 200 is a 2 Mb memory chip which is organized as 256 Kbyte by 8 bits. The conventional density memory device 200 would thus use 18 address lines ($A_0$–$A_{17}$) to uniquely identify each byte. The next smaller conventional density memory device is a 1 Mb chip organized as 128 Kbytes by 8 bits. However, often times the amount of memory an application (product) requires is greater that 1 Mb but less than 2 Mb. In these cases, it is advantageous to offer intermediate density memory devices such as the intermediate density semiconductor memory device 202 which is a 1.5 Mb chip organized as 192 Kbytes by 8 bits. Hence, if an application requires more than 128 Kbytes and less than 192 Kbytes, then the intermediate density semiconductor memory device 202 would be suitable for use by the application. The advantage of using the intermediate density semiconductor memory device 202 is that it would be a less expensive device (due to the smaller memory array, in this example 25% smaller). Another advantage is that the intermediate density semiconductor memory device 202 would preferably be pin-wise compatible with the next larger density semiconductor memory device 200 with 256 Kbytes. Such compatibility makes intermediate density memory devices commercially practical because they can be replaced by the next larger size conventional density memory device which serves as a second source.

Figure 3:
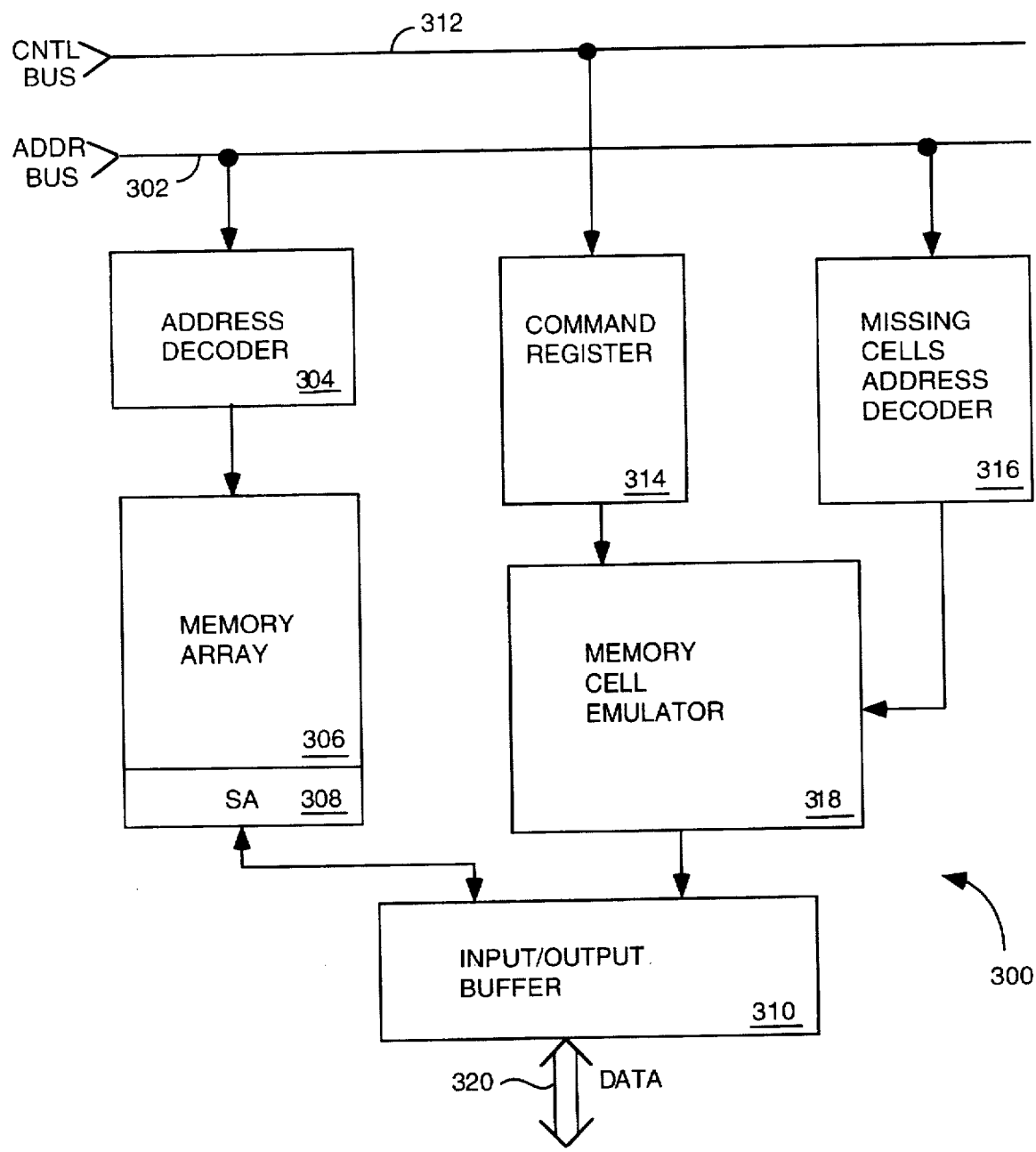
FIG. 3 is a block diagram of a semiconductor memory device according to a first embodiment of the invention.

FIG. 3 is a block diagram of a semiconductor memory device 300 according to a first embodiment of the invention. The semiconductor memory device 300 is coupled to an address bus 302 over which an address is received. An address decoder 304 is connected to the address bus 302 and decodes the received address into select signals. The select signals operate to select appropriate memory cells within a memory array 306. The selected memory cells within the memory array 306 then have their data forwarded to a sense amplifier 308. The data produced by the sense amplifier is in turn forwarded to an input/output buffer 310.

The semiconductor memory device 300 is also coupled to a control bus 312 over which control signals are received. A command register 314 receives the control signals via the control bus 312 and decodes the received control signals to identify specific types of commands being requested. In this regard, the control register 314 generates signals for read, erase, erase verify, write, and write verify. The control register 314 may also generate signals for device identifier (ID) read and manufacturer ID read as well as other signals for testing purposes. A missing cells address decoder 316 is coupled to the address bus 302 and identifies those addresses on the address bus 302 for which no actual memory cells exist in the memory array 306 (i.e., identifies missing cells). For example, with respect to implementation illustrated in FIG. 2, the addresses identified by the missing cells address decoder 316 would correspond to the addresses of the missing cells portion 206.

The addresses identified by the memory cells address decoder 316 are forwarded to a memory cell emulator 31 S. The memory cell emulator 318 also receives the decoded command information from a command register 314. Based on the identified addresses and the decoded command information, the memory cell emulator 318 operates to forward predetermined emulation information to the input/output buffer 310. The input/output buffer 310 is coupled to a data bus 320 over which data can be sent or received. The memory cell emulator 318 and the input/output buffer 310 together operate to emulate the operation of actual memory cells for the missing cells. Consequently, upon reading status information or retrieved data from the memory array 306 via the input/output buffer 310, the semiconductor memory device 300 gives the appearance to external software and hardware that the memory array 306 is larger than its actual physical size.

Figure 4:
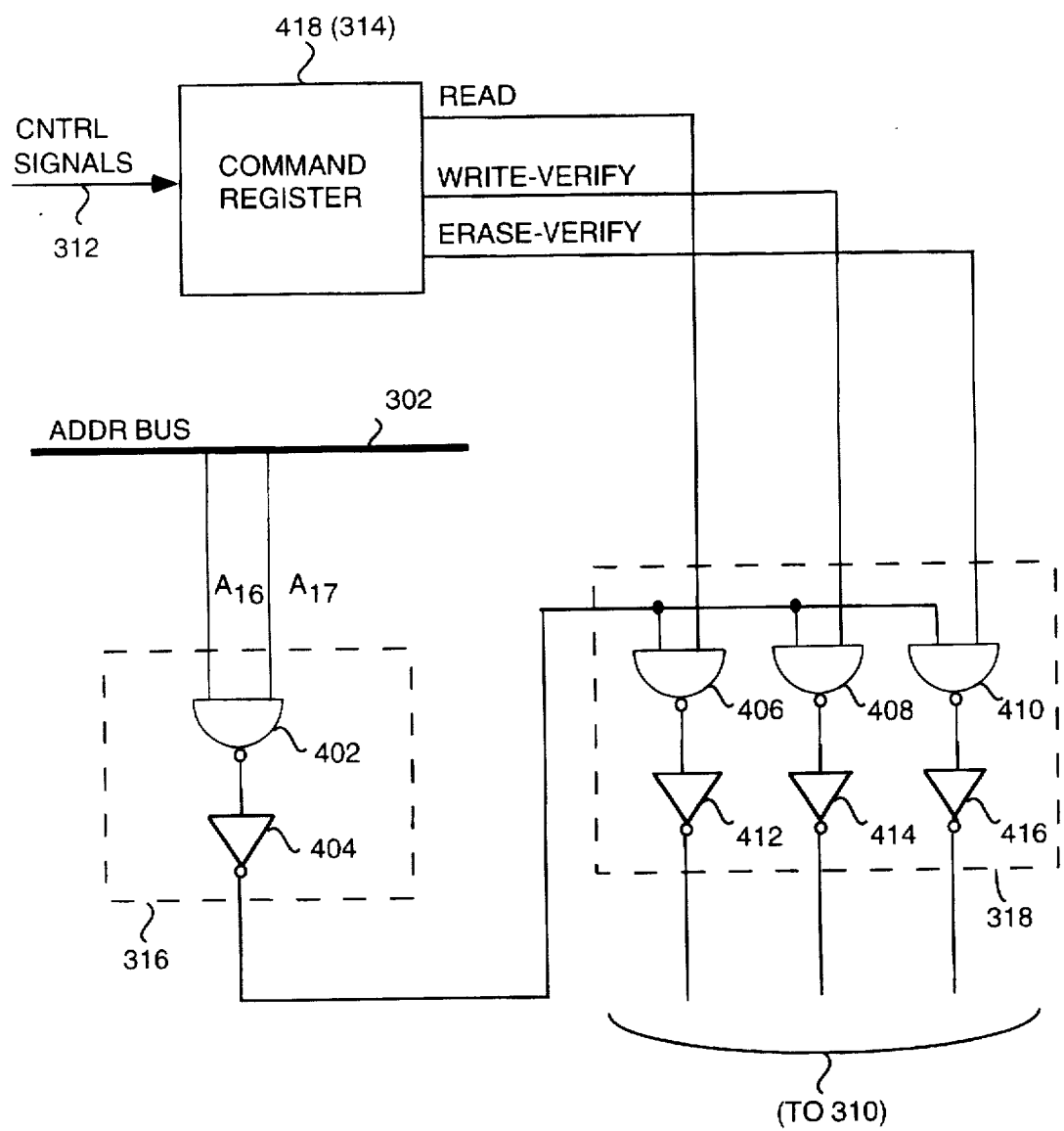
FIG. 4 is a block diagram of a detailed embodiment for portions of the semiconductor memory device illustrated in FIG. 3.

FIG. 4 is a block diagram of a detailed embodiment for portions of the semiconductor memory device 300 illustrated in FIG. 3. The circuitry illustrated in FIG. 4 pertains to the command register 314, the missing cells address decoder 316, and the memory cell emulator 318 portions of the semiconductor memory device 300 of FIG. 3.

In this detailed embodiment, the missing cells address decoder 316 includes a NAND gate 402 and an inverter 404. The NAND gate 402 receives two address lines as its inputs, and the output of the NAND gate 402 is inverted by the inverter 404. The output of the inverter 404 is then a missing cell indicator signal that is output from the missing cells address decoder 316. The missing cell indicator signal indicates whether the cells being addressed are missing. In the exemplary embodiment of a 1.5 Mb semiconductor memory device, the two address lines $A_{16}$ and $A_{17}$ from the address bus 302 are used as inputs to the missing cells address decoder 31b. When both the address lines are $A_{16}$ and $A_{17}$ are "high" (logical "1"), then the missing cell indicator signal indicates that the addressed memory cells are missing from the memory array 306.

The memory cell emulator 318 receives the missing cell indicator signal that is output from the missing cells address decoder 316. The missing cell indicator signal is received by a first input of NAND gates 406, 408 and 410. The output of the NAND gates 406, 408 and 410 are respectively inverted by inverters 412, 414 and 416. The second input of the NAND gates 406, 408 and 410 receive command indication signals from a command register 418. The command register 418 receives the control signals from the control bus 312 and outputs command indication signals depending upon the control signals. As an example, the control signals can indicate, among other things, a read command, a write-verify command, or an erase-verify command. In this embodiment, the command indication signals include a read command, a write-verify command, and an erase-verify command. These command indication signals that are determined by the command register 418 are then respectively forwarded to the second input terminal of the NAND gates 406, 408 and 410 within the memory cell emulator 318. The outputs of the inverters 412, 414 and 416 make up the output of the memory cell emulator 318 and are forwarded to the input/output buffer 310.

In this detailed embodiment, the outputs of the inverters 412, 414 and 416 are used to select the emulation to be performed for the missing cells. In other words, the emulation of the missing cells is done in response to data operations associated with the memory array 306. In this detailed embodiment, the memory cell emulator 318 operates to select or identify the emulation to be performed, if any. Then, the input/output buffer 310 operates to produce and then output the emulated data onto the data bus 320. As an example, when addressing the memory array 306 to perform a data operation, and where one of the command indication signals (e.g., a read command, a write-verify command, or a erase-verify command) output from the command register 418 are "high" (logical "1") and where the missing cell indicator signal is also "high" (logical "1"), the output of the corresponding one of the inverters 412, 414 and 416 will also be "high" (logical "1") and the output of the other of the inverters will be "low" (logical "0"). The output of the inverters 412, 414 and 416 thus indicates to the input/output buffer 310 the emulation to be performed. As an example, for the above-mentioned command indication signals, missing cells are emulated by: outputting $FF_{HEX}$ onto the data bus 320 during the read command; outputting $00^{HEX}$ onto the data bus 320 during the write-verify command; and outputting $FF_{HEX}$ onto the data bus 320 during the erase-verify command. The emulation of the missing cells thus produces the output data that is most logical given that the memory cells being addressed are not physically present.

By reading the data bus 320, external hardware and software can not only retrieve the requested data (which may or may not be emulated) but also status information. In other embodiments, as discussed below, the status information may be stored in an accessible status register internal to the semiconductor memory device 300 or otherwise internally obtained by polling.

Figure 5:
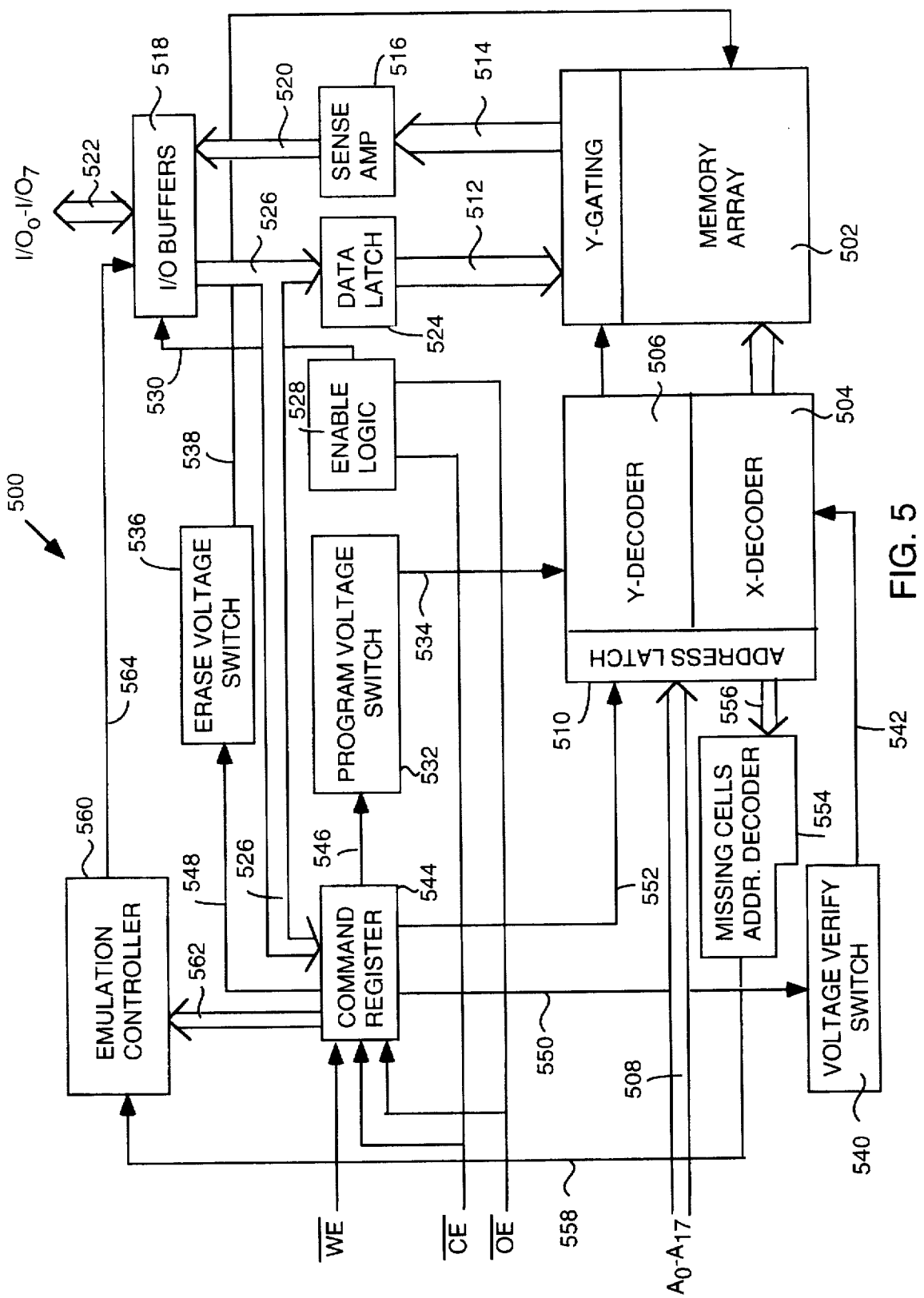
FIG. 5 is a block diagram of a semiconductor memory device according to a second embodiment of the invention.

FIG. 5 is a block diagram of a semiconductor memory device 500 according to a second embodiment of the invention. The semiconductor memory device 500 in a non-volatile electrically alterable semiconductor memory device. The semiconductor memory device 500 is a "standard" implementation in which data from input/output buffers provides not only retrieved or emulated data but also status information.

The semiconductor memory device 500 includes a memory array 502. In the exemplary embodiment, the memory array has 1,572,864 memory cells (bits) that are organized in 192 Kbytes by 8 bits. The memory cells are selected by word lines and bit lines supplied from an X-decoder 504 and a Y-decoder 506, respectively. An address bus 508 supplies address lines $A_0-A_{17}$ to an address latch 510. The address latch 510 in turn supplies X-addresses to the X-decoder 504 and Y-addresses to the Y-decoder 506.

The memory array 502 receives input data from a bus 512 or outputs data to a bus 514. The output data travels to sense amplifiers 516 over the bus 514. The amplified output data then travels from the sense amplifiers 516 to input/output (I/O) buffers 518 over a bus 520. The I/O buffers 518 are coupled to a data bus 522 which is accessible by external hardware or software. For data being input into the memory array 502, the input data is received at the I/O buffers 518 over the data bus 522. The input data then travels from the I/O buffers 518 to data latches 524 over a bus 526. The data latches 524 latch the input data and forward the input data to the memory array 502 over the bus 512. In the exemplary embodiment, the memory array 502 is eight (8) memory cells (bits) wide and the data bus 522 has eight lines I/O$_0$–I/O$_7$.

Enable logic 528 receives a chip-enable (/CE) signal and an output-enable (/OE) signal and outputs an enable signal 530. The enable signal 530 is supplied to the I/O buffers 518 to disable or enable the I/O buffers 518. A program voltage switch 532 is provided to produce a program voltage signal 534 for use in programming the memory cells within the memory array 502. The program voltage signal 534 is supplied to the memory array 502 via the decoders 504 and 506. An erase voltage switch 536 is provided to produce an erase voltage signal 538. The erase voltage signal 538 is supplied to the memory array 502 where it is used in erasing the memory cells within the memory array 502. A voltage verify switch 540 is also provided to produce a voltage verify signal 542. The voltage verify signal 542 is supplied to the memory array 502 via the decoders 504 and 506. In general, the voltage levels needed by the memory array 502 for the various operations of the semiconductor memory device 500 are provided by the switches 532, 536 and 540.

A command register 544 is controller or state machine for controlling the operations of the semiconductor memory device 500. The command register 544 receives the chip-enable (/CE) signal, the output-enable (/OE) signal, and a write-enable (/WE) signal. Based on the logical values of these three signals, the semiconductor memory device 500 can perform the requested data operation, including read, write (write-verify), and erase (erase-verify). Accordingly, to invoke the requested data operation, the command register 544 respectively outputs signals 546, 548 and 550 to the program voltage switch 532, the erase voltage switch 536, and the voltage verify switch 540. The command register 544 also outputs a signal 552 to the address latch 510 to latch addresses into the address latch 510.

The semiconductor memory device 500 further includes specialized circuitry for operating in accordance with the invention. The specialized circuitry includes a missing cells address decoder 554 that receives certain of the address lines via an address bus 556. In the exemplary embodiment, the certain address lines are the address lines A$_{16}$ and A$_{17}$. The output of the missing cells decoder 554 is a missing cells indicator 558. In the exemplary embodiment, when the address lines A$_{16}$ and A$_{17}$ are both "high" (logical "1"), then the missing cells indicator 558 serves to notify an emulation controller 560 that emulation of the missing cells is required. The emulation controller 560 also receives command information 562 from the command register 546. The command information 562 includes, for example, a signature mode overwrite signal, a read command signal, a write-verify command signal and an erase-verify command signal. Base on the command information 562 and the missing cells indicator 558, the emulation controller 560 operates to perform or control the performance of the emulation operations according to the invention by sending emulation control signals 564 to the I/O buffer 518. The emulation operations controlled by the emulation controller 560 are explained in the following paragraphs.

After an erase operation, when performing the erase-verify operation, the invention specialized circuitry functions such that the I/O buffers 518 output FF$_{HEX}$ during the erase-verify operation whenever the missing memory cells are being erase-verified. By doing so, the external programming algorithm is satisfied that the missing memory cells have been successfully erased despite the fact that they are not physically present in the memory array 502 of the intermediate density memory device 500. In the case of an "embedded" implementation, the internal programming algorithm can be likewise satisfied by providing the necessary status information internally to the internal programming algorithm (see FIG. 7).

After every write operation, the write-verify operation should read back from the I/O buffers 518 the same byte as the written byte of data. If a byte of data 00$_{HEX}$ is written, then 00$_{HEX}$ should be read back from the I/O buffers 518. In the case of missing cells, the specialized circuitry provided by the invention causes the I/O buffers 518 to output 00$_{HEX}$ so that missing cells in this case act like written cells.

During a read operation of the missing cells, the specialized circuitry of the invention causes the missing cells to act like erased cells. This is desirable because the missing cells should not (and cannot) be written. Hence, in this case, the I/O buffers output FF$_{HEX}$ during the read operation of the missing memory cells.

Further, such semiconductor memory devices typically have a signature mode in which a manufacturer and/or part identification number can be read from the semiconductor memory device. When this information is accessed with an address corresponding to the missing cells portion, the specialized circuitry preferably also makes this information available. In other words, this information will be available to be properly read according to the invention even if it happens to have an address corresponding to the missing cells portion.

Figure 6A:
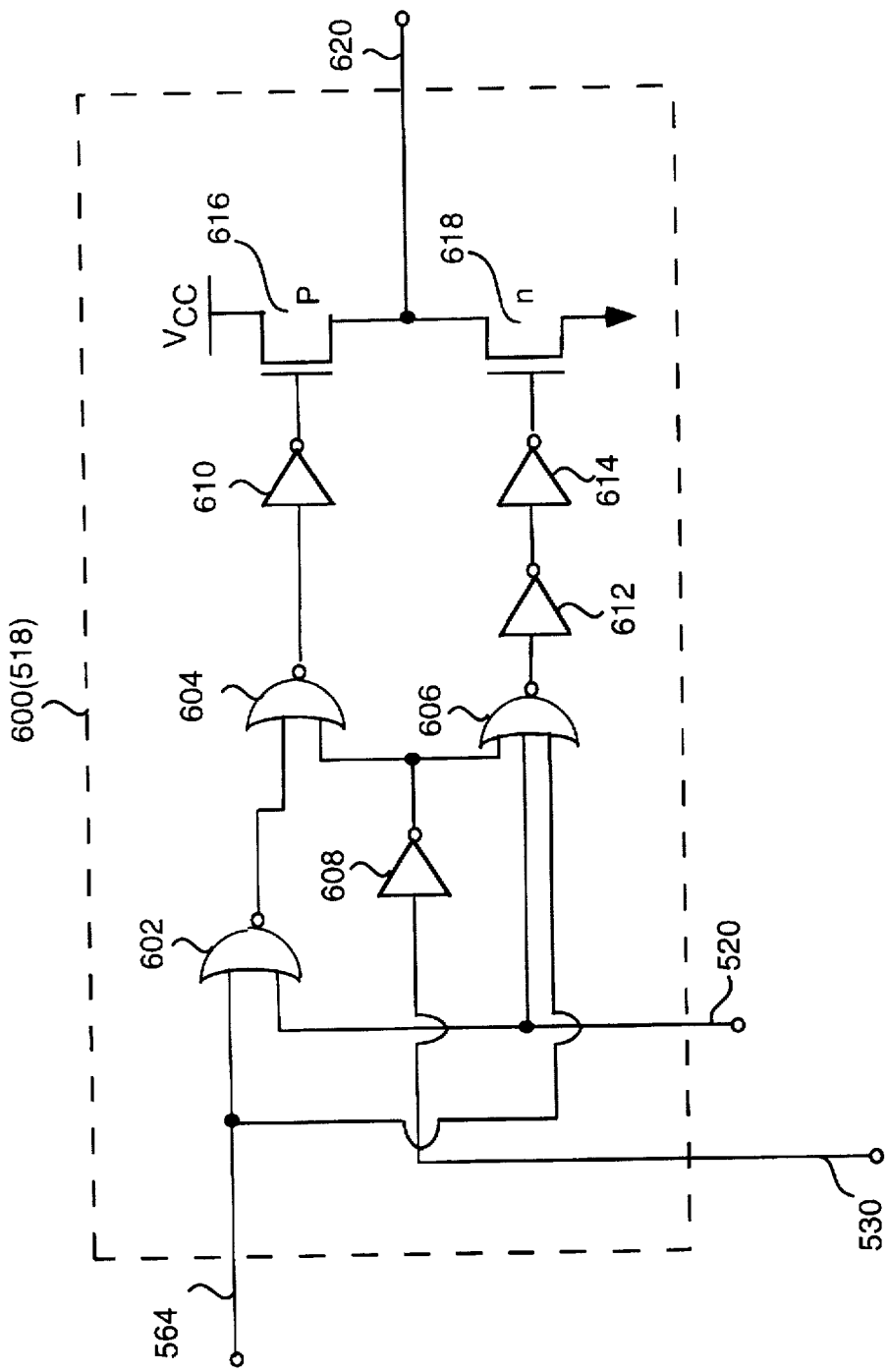
FIG. 6A is a detailed schematic diagram of an I/O buffer according to an embodiment of the invention.

FIG. 6A is a detailed schematic diagram of an I/O buffer 600 according to an embodiment of the invention. The I/O buffer 600 can be used for each of the lines of the I/O buffers 518. The I/O buffer 600 according to this embodiment is constructed from NOR gates 602, 604 and 606, inverters 608, 610, 612 and 614, and field-effect transistors (FETs) 616 and 618. The output from the I/O buffer 600 is provided at an output line 620 that couples to a line of the data bus 522. The NOR gate 602 receives the emulation control signal 564 and one of the bus signals 520 as inputs. The output of the NOR gate 602 is one input to the NOR gate 604 and another input to the NOR gate 604 is the output of the inverter 608. The output of the inverter 608 is the enable signal 530 inverted. The output of the NOR gate 604 is then inverted by the inverter 610 whose output is coupled to the gate terminal of the (p-channel) FET 616. The NOR 606 receives the output of the inverter 608, the one of the bus signals 520, and the emulation control signal 564. The output of the NOR 606 is successively inverted by the inverters 612 and 614. The output of the inverter 614 is coupled to the gate terminal of the (n-channel) FET 618. The drain terminal of the FET 616 is coupled to V$_{CC}$ and the source terminal of the FET 618 is coupled to ground. The output line 620 of the I/O buffer 600 is obtained from the commonly connected source terminal of the FET 616 and the drain terminal of the FET 618. When the emulation control signal 564 is "high" (logical "1") and the enable signal 530 is "high" (logical "1"), then the output line 620 is pulled "high" (pulled to a logical "1") by the FET 616. On the other hand, when the emulation control signal 564 is "low" (logical "0") and the enable signal 530 is "high" (logical "1"), then the output line 620 is pulled "high" or "low" according to the bus signal 520 supplied from the corresponding sense amplifier 516.

Figure 6B:
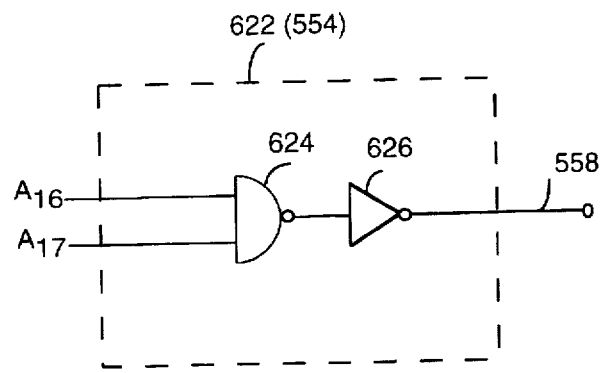
FIG. 6B is a detailed schematic diagram of a missing cells address decoder.

FIG. 6B is a detailed schematic diagram of a missing cells address decoder 622. The missing cells address decoder 622 can be used for the missing cells address decoder 554 in FIG. 5. The missing cells address decoder 622 according to this embodiment is constructed from a NAND gate 624 and an inverter 626. The inputs to the NAND gate 624 are the address lines $A_{16}$ and $A_{17}$, and the output of the NAND gate 624 is inverted by the inverter 626. The output of the inverter 626 is the missing cells indicator 558 which is also the output of the missing cells address decoder 622. In this design, when the address lines $A_{16}$ and $A_{17}$ are "high" (logical "1"), the missing cells indicator 558 is "high" (logical "1") thus indicating that the address being decoded is in the missing cells portion 206.

Figure 6C:
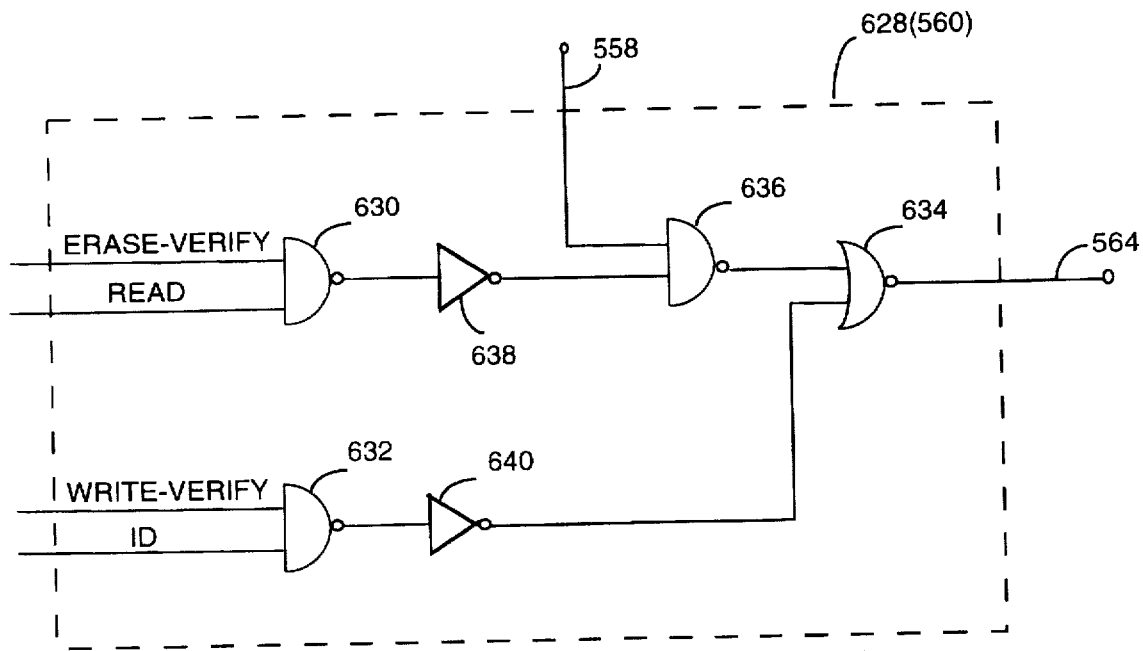
FIG. 6C is a detailed schematic diagram of an emulation controller according to an embodiment of the diagram.

FIG. 6C is a detailed schematic diagram of an emulation controller 628 according to an embodiment of the diagram. The emulation controller 628 can be used for the emulation controller 560 in FIG. 5. The emulation controller 628 according to this embodiment is constructed from NOR gates 630, 632 and 634, NAND gate 636 and inverters 638 and 640. The read command signal (READ) and the erase-verify command signal (ERASE-VERIFY) are received as inputs to the NOR gate 630. The output of the NOR gate 630 is inverted by the inverter 638 and supplied the NAND gate 636 as an input. The missing cells indicator 558 is received from the missing cells address decoder 554, 622 as the second input to the NAND gate 636. The write-verify command signal (WRITE-VERIFY) and a signature mode override signal (ID) are received as inputs to the NOR gate 632. The output of the NOR gate 632 is inverted by the inverter 640 and supplied as an input to the NOR gate 634. The output from the NAND gate 636 serves as another input to the NOR gate 634. The output of the NOR gate 634 is the emulation control signal 564 and also the output of the emulation controller 628.

Figure 6D:
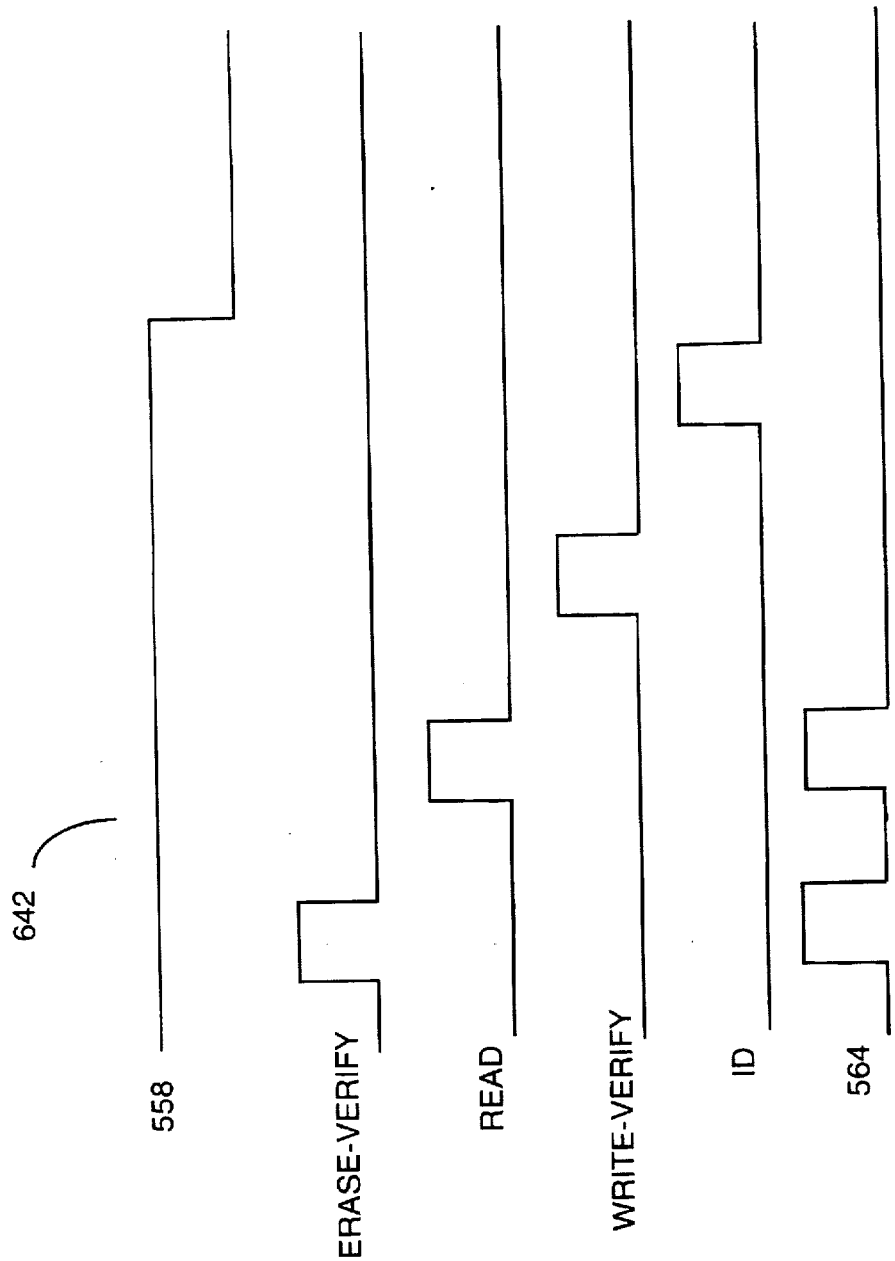
FIG. 6D is a timing diagram for the emulation controller illustrated in FIG. 6C.

FIG. 6D is a timing diagram 642 for the emulation controller 628 illustrated in FIG. 6C. The emulation control signal 564 produced by the emulation controller 628 is "high" (logical "1") during both the erase-verify operation and the read operations so long as the missing cells indicator 558 is "high". This condition causes the output line 620 of the I/O buffer 600 to be pulled "high" (pulled to a logical "1"). For the write-verify operation, the emulation control signal 564 is "low" (logical "0"), thus causing the output line 620 of the I/O buffer 518 to couple to the bus signal 520 from the sense amplifier 516 so as to output data from the memory cell 502. A missing cell behaves like a written cell (e.g., in this implementation because both do not conduct current) and thus the output line 620 of the I/O buffer 600 is pulled "low" (pulled to a logical "0"). With the signature override signal (ID), the emulation control signal 564 is also "low" (logical "0") and thus causing the output line 620 of the I/O buffer 518 to couple to the bus signal 520 from the sense amplifier 516 which is in turn connected to a code indicating the identifier (device ID or manufacturer ID), even in the cases where the address is within the missing cells portion 206.

Figure 7:
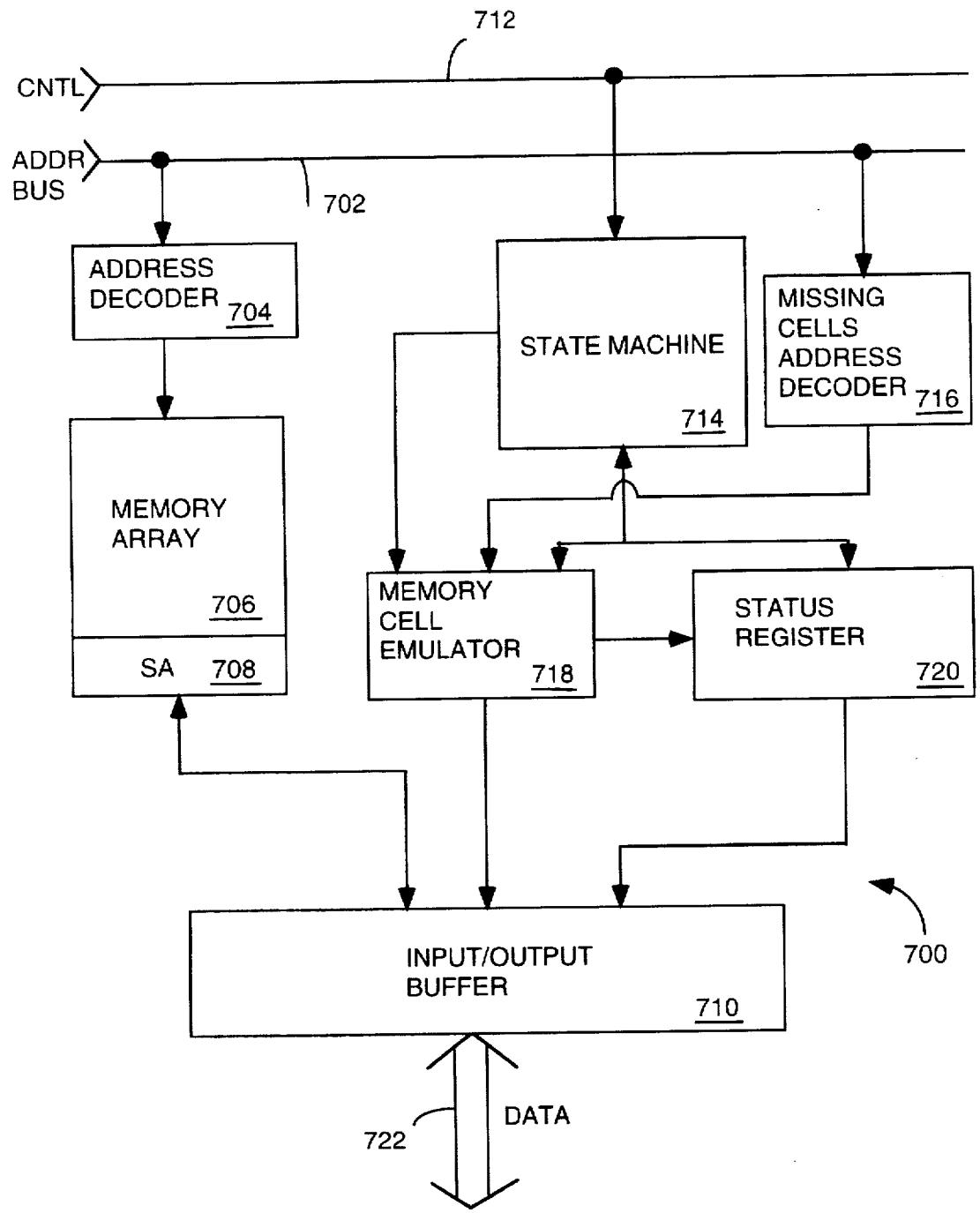
FIG. 7 is block diagram of a semiconductor memory device according to a third embodiment of the invention.

FIG. 7 is a block diagram of a semiconductor memory device 700 according to a third embodiment of the invention. The semiconductor memory device 700 has a design in which programming and erase operations are embedded within the semiconductor memory device 700 and its interface to hardware and software as to the performance of data operations is communicated through a status register which is accessible by an output buffer. Semiconductor memory devices having embedded programming and erase operations are known. See, e.g., Am29F200 which is a 2 Mb FLASH memory chip produced by Advanced Micro Devices of Sunnyvale, CA.

The semiconductor memory device 700 receives address signals over an address bus 702. An address decoder 704 is coupled to the address bus 702 to receive the address signals. The address decoder 704 decodes the address signals and identifies particular memory cells within a memory array 706 that are being addressed. Data retrieved from the particular memory cells within the memory array 706 is then forwarded to sense amplifiers 708. The output of the sense amplifiers 708 is coupled to an input/output buffer 710.

The semiconductor memory device 700 also receives control signals from a control bus 712. A state machine 714 is coupled to the control bus 712 to receive the control signals and generally control data operations performed by the semiconductor memory device 700. In particular, the state machine 714 operates to perform read, write (program), write verify, erase, and erase verify operations with respect to the memory array 706. As a result, this embodiment is referred to as embedded design because embedded programming (within the state machine 714) is provided to perform the programming and erase operation, thus external software for such functions is not required.

The semiconductor memory device 700 also includes a missing cells address decoder 716, a memory cell emulator 718 and a status register 720. The missing cells address decoder 716 is coupled to the address bus 702 and receives address signals therefrom. Based on the address signals, the missing cells address decoder 716 determines whether a memory access request is addressing memory cells that do not exist in the memory cells array 706. These memory cells which do not exist are referred to as missing memory cells. The missing cells address decoder 716 thus produces a missing cells indicator signal that is forwarded to the memory cell emulator 718. The memory cell emulator 718 also receives command signals as well status information from the state machine 714.

The memory cell emulator 718 operates to emulate missing cells as needed. When the missing cells indicator signal indicates that the memory cells being addressed are missing, the memory cell emulator 718 will control (or provide) emulated data to be provided to the input/out buffer 710. The emulated data is then output on the data bus 722. For example, during a read command (as identified by the state machine 714) of missing cells, the memory cell emulator 718 would cause the I/O buffer 710 to output $FF_{HEX}$. The memory cell emulator 718 may also modify the status information being supplied to the status register 720. The modification of the status information stored or to be stored in the status register 720 is part of the emulation process. For example, during an erase-verify command or write-verify command for missing cells, the status register 720 should signal that the erase-verify command or the write-verify command is complete and allow processing to continue. The memory cell emulator 718 causes the status information so modified. In other words, when the missing cells indicator signal indicates that the memory cell being addressed is missing, the memory cell emulator 718 alters the status information from the state machine 714 and substitutes predetermined status information therefor. On the other hand, when the missing cells signal indicates that the memory cells being addressed actually exist within the memory array 706, then the memory cell emulator 718 does not cause the status information to be modified. External hardware and software are able to determine the status of operations performed by the semiconductor memory device 700 by monitoring the contents of the status register 720 through the output buffer 710 via a data bus 722.

In the above-described embodiments, the intermediate density memory device is compatible with the next higher conventional density memory device. For example, in the exemplary embodiment discussed above, a 1.5 Mb intermediate density memory device is compatible with a 2 Mb conventional density memory device, provided that the missing 0.5 Mb of storage not present in the intermediate density memory device is not needed. Although in the exemplary embodiment discussed above a 1.5 Mb chip is interchangeable with a 2 Mb chip, the invention is applicable to a variety of different size chips. Conventionally, EEPROM or FLASH memory chips are offered in set sizes of 512 Kb, 1 Mb, 2 Mb, 4 Mb, 8 Mb, 16 Mb and 32 Mb. Notice that each next larger size is a power of two larger than the previous size. Examples of the corresponding intermediate density memory chips would be suitable are illustrated in Table 1 below.

TABLE 1

| CONVENTIONAL DENSITY (Mb) | INTERMEDIATE DENSITY (Mb) |
| --- | --- |
| 2 | 1.25, 1.5, 1.75 |
| 4 | 2.5, 3, 3.5 |
| 8 | 5, 6, 7 |
| 16 | 10, 12, 14 |

Figure 8:
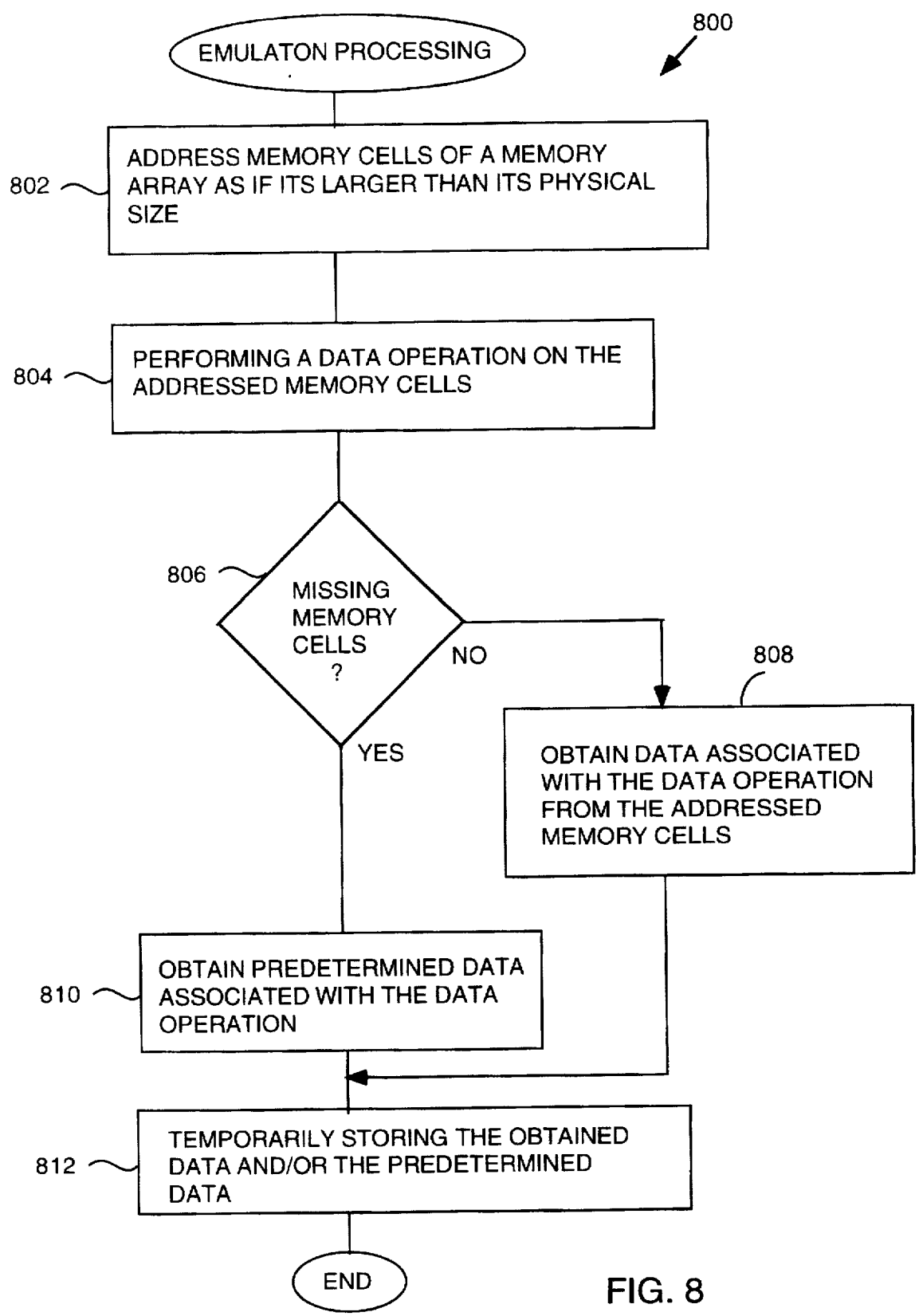
FIG. 8 illustrated a flow diagram of an emulation processing according to the invention.

The invention may also be embodied as a method for emulating a larger, conventional sized memory device using a smaller, intermediate sized memory device. FIG. 8 illustrated a flow diagram of an emulation processing 800 according to the invention. The emulation processing 800 is preferably performed by a semiconductor memory device such as illustrated in FIGS. 3, 5 and 7. Initially, in block 802, the emulation processing 800 addresses memory cells of a memory array as if its larger than its physical size. For example, addressing an intermediate density semiconductor memory chip with 1.5 Mb of memory as if it were a larger, conventional density semiconductor memory chip with 2 Mb of memory. Next, in block 804, a requested data operation that is associated with the addressed memory cells is performed. As an example, the data operation may include read, write (program) and erase operations. A decision block 806 then determines whether the addressed memory cells are missing memory cells. The addressed memory cells are missing when they are not in the memory array of the intermediate density semiconductor memory chip but would be within the larger, conventional density semiconductor memory chip. If the decision block determines that the addressed memory cells are not missing but in fact physically present in the memory array, then data associated with the data operation is obtained from the addressed memory cells in block 808. The obtained data can be either data read from the addressed memory cells or status data determined in accordance with the data read from the addressed memory cells. For example, in the case of electrically alterable semiconductor memory device, a read operation, the obtained data may be the data read from the addresses memory cells, and for a write-verify operation or an erase-verify operation, the obtained data may be the status data determined in accordance with the data read from the addressed memory cells. On the other hand, when the decision block 806 determines that the addressed memory cells are missing and thus not physically present in the memory array, then predetermined data associated with the data operation is obtained in block 810. For example, the predetermined data may be "high" (logical "1") for the read operation and for the erase-verify operation, and may be "low" (logical "0") for the write-verify operation. In this way, the predetermined data provided for the missing cells is most logical given that the memory cells being addressed are not physically present. Following either block 808 or 810, the obtained data and/or the predetermined data is temporarily stored (812). The temporary storage can be provided in various places depending on the implementation. Some examples of places providing the temporary storage include an output buffer, a status register, an emulation controller, etc. Following block 812, the emulation processing 800 is complete and ends. Note that the blocks 804 and 806 could also be reversed depending on the implementation.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A programmable and erasable non-volatile memory device, comprising:

a memory array of memory cells;

an address decoder coupled to an address bus, said address decoder decodes address signals on the address bus to address particular ones of the memory cells;

a device controller coupled to receive control signals and to command operations of said memory device in accordance with the control signals;

an output buffer coupled to said memory array and a data bus;

a missing cells address decoder coupled to the address bus, said missing cells address decoder decodes a portion of said memory array that is addressable but for which memory cells are missing and therefore not present in said memory array; and a memory cell emulator coupled to said device controller, said output buffer and said missing cells address decoder, said memory cell emulator operates to emulate actual memory cells for the missing memory cells.

2. A programmable and erasable non-volatile memory device as recited in claim 1, wherein said device controller receives the control signals and identifies one of a read operation, a write-verify operation, and an erase-verify operation based on the control signals.

3. A programmable and erasable non-volatile memory device as recited in claim 2, wherein the identified one of the read operation, the write-verify operation and the erase-verify operation is used by said memory cell emulator to induce an appropriate output value at said output buffer.

4. A programmable and erasable non-volatile memory device as recited in claim 1, wherein said device controller comprises:

a state machine for controlling at least the programming and erasing of the memory cells in said memory array.

5. A programmable and erasable non-volatile memory device as recited in claim 1, wherein said device controller comprises:

a state machine for at least controlling the programming and erasing of the memory cells in said memory array, and wherein said memory device further comprises:

a status register coupled to said output buffer, said memory cell emulator and said state machine, said status register storing status flags that can be read via the data bus.

* * * * *